(12) United States Patent
Andrews et al.

(10) Patent No.: US 11,181,323 B2
(45) Date of Patent: Nov. 23, 2021

(54) HEAT-DISSIPATING DEVICE WITH INTERFACIAL ENHANCEMENTS

(71) Applicant: QUALCOMM Incorporated, San Diego, CA (US)

(72) Inventors: Sean Charles Andrews, Solana Beach, CA (US); Jorge Luis Rosales, San Diego, CA (US); Victor Adrian Chiriac, Phoenix, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 16/281,477

(22) Filed: Feb. 21, 2019

(65) Prior Publication Data
US 2020/0271388 A1    Aug. 27, 2020

(51) Int. Cl.
| | | |
|---|---|---|
| F28D 15/02 | (2006.01) | |
| F28F 21/08 | (2006.01) | |
| H01L 23/427 | (2006.01) | |

(52) U.S. Cl.
CPC ............ *F28D 15/02* (2013.01); *F28F 21/085* (2013.01); *F28F 21/089* (2013.01); *H01L 23/4275* (2013.01)

(58) Field of Classification Search
CPC .. F28D 15/02; F28D 2015/0225; F28D 15/04; F28D 15/046; F28D 15/06;
(Continued)

(56) References Cited

U.S. PATENT DOCUMENTS

| | | | | |
|---|---|---|---|---|
| 4,775,588 A | * | 10/1988 | Ishii .......................... | B05D 5/04 427/240 |
| 5,691,062 A | * | 11/1997 | Shalaby ..................... | C08J 7/12 428/411.1 |

(Continued)

FOREIGN PATENT DOCUMENTS

| | | |
|---|---|---|
| CN | 102440086 A | 5/2012 |
| CN | 103000595 A | 3/2013 |

(Continued)

OTHER PUBLICATIONS

Hong Y., et al., "Tuning Thermal Contact Conductance at Graphene—Copper Interface via Surface Nanoengineering", Nanoscale, The Royal Society of Chemistry, 2015, pp. 6286-6294.
(Continued)

*Primary Examiner* — Jianying C Atkisson
*Assistant Examiner* — Jose O Class-Quinones
(74) *Attorney, Agent, or Firm* — Patterson & Sheridan, L.L.P.

(57) ABSTRACT

An example heat-dissipating device with enhanced interfacial properties generally includes a first heat spreader configured to be thermally coupled to a region configured to generate heat, a second heat spreader, an interposer thermally coupled to at least one of the first heat spreader or the second heat spreader, at least one interfacial layer including a graphene material disposed on at least one surface of the interposer, and a phase change material disposed between the at least one interfacial layer and at least one of the first heat spreader or the second heat spreader and thermally coupled to at least one of the first heat spreader or the second heat spreader.

20 Claims, 6 Drawing Sheets

(58) Field of Classification Search
CPC ............ F28D 2020/0008; F28D 20/02; F28D 20/021; F28D 20/028; F28D 2021/0028; H01L 23/3737; H01L 23/427; H01L 23/4275; H05K 7/20336; H05K 7/2039; H05K 7/20481; H05K 7/2029; H05K 7/20663; H05K 7/20809; H05K 7/20881; H05K 7/20936; H05K 7/2099; F28F 23/00

See application file for complete search history.

(56) References Cited

U.S. PATENT DOCUMENTS

| | | | |
|---|---|---|---|
| 6,226,178 B1 | 5/2001 | Broder et al. | |
| 6,503,564 B1* | 1/2003 | Fleming | B05D 1/60 427/255.6 |
| 6,674,642 B1 | 1/2004 | Chu et al. | |
| 6,938,678 B1 | 9/2005 | Bortolini et al. | |
| 7,184,265 B2 | 2/2007 | Kim et al. | |
| 7,188,484 B2 | 3/2007 | Kim | |
| 7,249,627 B2 | 7/2007 | Choi et al. | |
| 7,420,807 B2 | 9/2008 | Mikubo et al. | |
| 7,486,517 B2 | 2/2009 | Aapro et al. | |
| 7,552,759 B2 | 6/2009 | Liu et al. | |
| 8,058,724 B2* | 11/2011 | Refai-Ahmed | H01L 23/427 257/707 |
| 8,443,874 B2* | 5/2013 | Mikami | G06F 1/203 165/276 |
| 8,587,945 B1* | 11/2013 | Hartmann | G06F 1/203 361/708 |
| 8,716,689 B2 | 5/2014 | Chen et al. | |
| 8,763,681 B2 | 7/2014 | Agostini et al. | |
| 9,007,769 B2 | 4/2015 | Cheng et al. | |
| 9,048,188 B2* | 6/2015 | Maldonado | C23C 22/05 |
| 9,097,467 B2 | 8/2015 | Gradinger et al. | |
| 9,261,309 B2 | 2/2016 | Wang | |
| 9,546,826 B1* | 1/2017 | Carter | F28D 15/02 |
| 9,918,407 B2 | 3/2018 | Rosales et al. | |
| 9,930,808 B2* | 3/2018 | Li | H01L 23/373 |
| 9,999,157 B2 | 6/2018 | Chiriac et al. | |
| 2001/0003308 A1* | 6/2001 | Li | F28D 15/046 165/104.33 |
| 2001/0017762 A1 | 8/2001 | Ueda et al. | |
| 2002/0015288 A1* | 2/2002 | Dibene, II | H01R 12/7088 361/711 |
| 2002/0036890 A1* | 3/2002 | Furuya | H01L 23/427 361/702 |
| 2002/0056542 A1* | 5/2002 | Yamamoto | F28D 15/0233 165/80.3 |
| 2002/0104641 A1* | 8/2002 | Searls | H01L 23/4275 165/10 |
| 2002/0144804 A1* | 10/2002 | Liang | F28D 15/0233 165/104.33 |
| 2002/0170705 A1 | 11/2002 | Cho et al. | |
| 2003/0079865 A1 | 5/2003 | Son et al. | |
| 2003/0205364 A1 | 11/2003 | Sauciuc et al. | |
| 2004/0040696 A1* | 3/2004 | Cho | H01L 23/427 165/104.26 |
| 2004/0093889 A1* | 5/2004 | Bureau | F28D 7/0025 62/434 |
| 2004/0190253 A1 | 9/2004 | Prasher et al. | |
| 2005/0051304 A1 | 3/2005 | Makino et al. | |
| 2005/0087327 A1* | 4/2005 | Wang | H01L 23/427 165/104.21 |
| 2005/0099776 A1 | 5/2005 | Xue et al. | |
| 2005/0116336 A1* | 6/2005 | Chopra | H01L 23/373 257/720 |
| 2005/0129928 A1* | 6/2005 | Lee | B82Y 30/00 428/323 |
| 2005/0141195 A1* | 6/2005 | Pokharna | F28F 3/025 361/699 |
| 2005/0207120 A1* | 9/2005 | Tseng | H01L 23/427 361/700 |
| 2006/0005950 A1* | 1/2006 | Wang | F28D 15/046 165/104.26 |
| 2006/0157227 A1 | 7/2006 | Choi et al. | |
| 2006/0243425 A1* | 11/2006 | Dussinger | F28D 15/0233 165/104.26 |
| 2007/0012427 A1 | 1/2007 | Liu et al. | |
| 2007/0025081 A1 | 2/2007 | Berlin et al. | |
| 2007/0029070 A1 | 2/2007 | Yamamoto et al. | |
| 2007/0068654 A1 | 3/2007 | Chang | |
| 2007/0151275 A1 | 7/2007 | Chiriac | |
| 2007/0158052 A1* | 7/2007 | Lin | H01L 23/427 165/104.33 |
| 2007/0284090 A1 | 12/2007 | Wu et al. | |
| 2008/0047684 A1* | 2/2008 | Noel | F28D 20/023 165/46 |
| 2008/0142195 A1 | 6/2008 | Erturk et al. | |
| 2009/0232991 A1* | 9/2009 | Wang | H01L 23/433 427/294 |
| 2010/0044014 A1 | 2/2010 | Ho et al. | |
| 2011/0003143 A1* | 1/2011 | Sugimoto | B82Y 30/00 428/330 |
| 2011/0051071 A1 | 3/2011 | Nakamichi et al. | |
| 2011/0108978 A1* | 5/2011 | Kim | H01L 29/1606 257/712 |
| 2011/0198059 A1* | 8/2011 | Gavillet | F28D 15/046 165/104.26 |
| 2011/0232874 A1 | 9/2011 | Xu et al. | |
| 2011/0279978 A1 | 11/2011 | Yoshikawa et al. | |
| 2012/0111553 A1 | 5/2012 | Tsoi et al. | |
| 2012/0199322 A1 | 8/2012 | Frigiere et al. | |
| 2013/0141866 A1* | 6/2013 | Refai-Ahmed | H01L 23/3672 361/679.54 |
| 2013/0270721 A1 | 10/2013 | Chiriac et al. | |
| 2014/0138052 A1 | 5/2014 | Hsieh et al. | |
| 2014/0238645 A1* | 8/2014 | Enright | F28D 15/02 165/104.21 |
| 2014/0246176 A1 | 9/2014 | Yang | |
| 2014/0352926 A1 | 12/2014 | Sun et al. | |
| 2014/0377145 A1 | 12/2014 | Govyadinov et al. | |
| 2015/0000866 A1 | 1/2015 | Lin et al. | |
| 2015/0198380 A1* | 7/2015 | Haj-Hariri | F01D 5/187 62/3.2 |
| 2015/0257308 A1* | 9/2015 | Li | H05K 7/20427 361/706 |
| 2015/0268704 A1* | 9/2015 | Chiriac | H05K 7/20445 361/679.54 |
| 2015/0315449 A1* | 11/2015 | Kim | B82Y 30/00 165/185 |
| 2016/0037681 A1 | 2/2016 | Lee et al. | |
| 2016/0076819 A1 | 3/2016 | Espersen et al. | |
| 2016/0102109 A1* | 4/2016 | Maeda | H01L 23/293 252/74 |
| 2016/0369936 A1* | 12/2016 | Hwang | B32B 27/06 |
| 2017/0202104 A1* | 7/2017 | Lin | H05K 7/2039 |
| 2017/0293329 A1 | 10/2017 | Chiriac et al. | |
| 2017/0295671 A1 | 10/2017 | Chiriac et al. | |
| 2017/0303433 A1* | 10/2017 | Delano | G06F 1/20 |
| 2017/0333941 A1* | 11/2017 | Park | F28F 13/187 |
| 2018/0015460 A1 | 1/2018 | Sells et al. | |
| 2018/0157297 A1* | 6/2018 | Delano | G06F 1/203 |
| 2019/0257589 A1 | 8/2019 | Rosales et al. | |

FOREIGN PATENT DOCUMENTS

| | | |
|---|---|---|
| CN | 102589197 B | 4/2014 |
| EP | 2348271 A1 | 7/2011 |
| JP | 2000252671 A | 9/2000 |
| JP | 2001024372 A | 1/2001 |
| JP | 2004349652 A | 12/2004 |
| JP | 2005142513 A | 6/2005 |
| JP | 2006191123 A | 7/2006 |
| JP | 2006242176 A | 9/2006 |
| JP | 2007113864 A | 5/2007 |
| JP | 2010203694 A | 9/2010 |
| JP | 2010236792 A | 10/2010 |
| JP | 2015032776 A | 2/2015 |
| KR | 20130093596 A | 8/2013 |

(56) References Cited

FOREIGN PATENT DOCUMENTS

| WO | 2007130668 A2 | 11/2007 |
| WO | 2012161002 A1 | 11/2012 |
| WO | 2015142669 A1 | 9/2015 |
| WO | 2015154044 A1 | 10/2015 |
| WO | 2017180524 A1 | 10/2017 |
| WO | 2018031218 A1 | 2/2018 |

OTHER PUBLICATIONS

Himran S., et al., "Characterization of Alkanes and Paraffin Waxes for Application as Phase Change Energy Storage Medium", Energy Sources Journal, vol. 16, 1994, pp. 117-128.

* cited by examiner

FRONT SIDE

BACK SIDE

HEAT-DISSIPATING DEVICE WITH INTERFACIAL ENHANCEMENTS

BACKGROUND

Field of the Disclosure

The teachings of the present disclosure relate generally to a heat-dissipating device, and more particularly, to a heat-dissipating device with interfacial enhancements for an electronic device.

Description of Related Art

Electronic devices include internal components that generate heat. Some of these internal components (e.g., a central processing unit (CPU), a graphics processing unit (GPU), and/or memory) can generate a lot of heat, especially when performing data intensive operations (e.g., processing video and/or music). To counter or dissipate the heat generated by the CPU and/or GPU, an electronic device may include a heat-dissipating device, such as a heat spreader. As an example, a mobile device may include a heat spreader for dissipating heat generated by an integrated circuit (IC). The heat spreader may be coupled between the IC and a back side of the mobile device enabling heat generated by the IC to be dissipated through the heat spreader and the back side of the mobile device. However, the heat spreader has limitations, including its limited heat-dissipating capabilities. For example, the heat spreader implemented in a mobile device may be limited to dissipate about 3 W of heat.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure provide a heat-dissipating device. The heat-dissipating device generally includes a first heat spreader configured to be thermally coupled to a region configured to generate heat, a second heat spreader, an interposer thermally coupled to at least one of the first heat spreader or the second heat spreader, at least one interfacial layer comprising a graphene material disposed on at least one surface of the interposer, and a phase change material disposed between the at least one interfacial layer and at least one of the first heat spreader or the second heat spreader and thermally coupled to at least one of the first heat spreader or the second heat spreader.

Certain aspects of the present disclosure provide a heat-dissipating device. The heat-dissipating device generally includes a first heat spreader configured to be thermally coupled to a region configured to generate heat, a second heat spreader, an interposer comprising at least one functionalize surface and thermally coupled to at least one of the first heat spreader or the second heat spreader, and a phase change material disposed between the interposer and at least one of the first heat spreader or the second heat spreader and thermally coupled to at least one of the first heat spreader or the second heat spreader. The at least one functionalize surface of the interposer is configured to increase a contacting area between the interposer and the phase change material.

Certain aspects of the present disclosure provide an apparatus. The apparatus generally includes first means for spreading heat configured to be thermally coupled to means for generating heat, second means for spreading heat, means for separating the first means for spreading heat from the second means for spreading heat, means for storing heat disposed between the means for separating and at least one of the first means for spreading heat or the second means for spreading heat and thermally coupled to at least one of the first means for spreading heat or the second means for spreading heat, and means for reducing a thermal resistivity between the means for separating and the means for storing heat. The means for separating is thermally coupled to at least one of the first means for spreading heat or the second means for spreading heat.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

Figure 1:
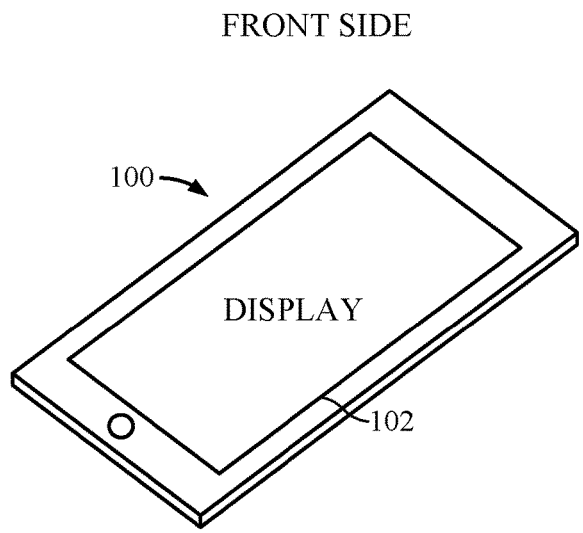
FIG. 1 illustrates a front view of an example mobile device.
Figure 2:
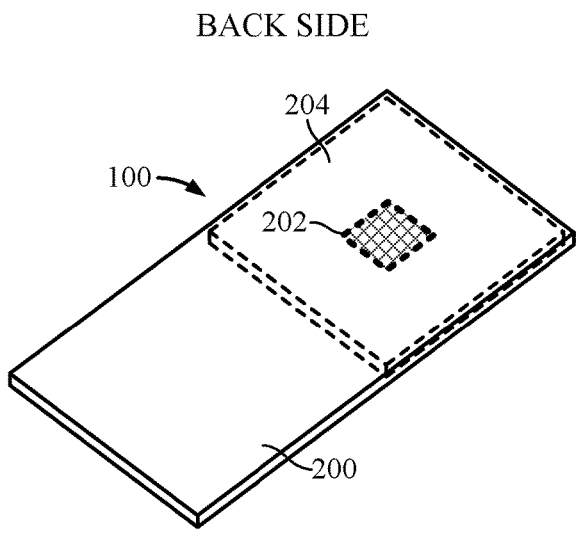
FIG. 2 illustrates a back view of the example mobile device of FIG. 1.
Figure 3:
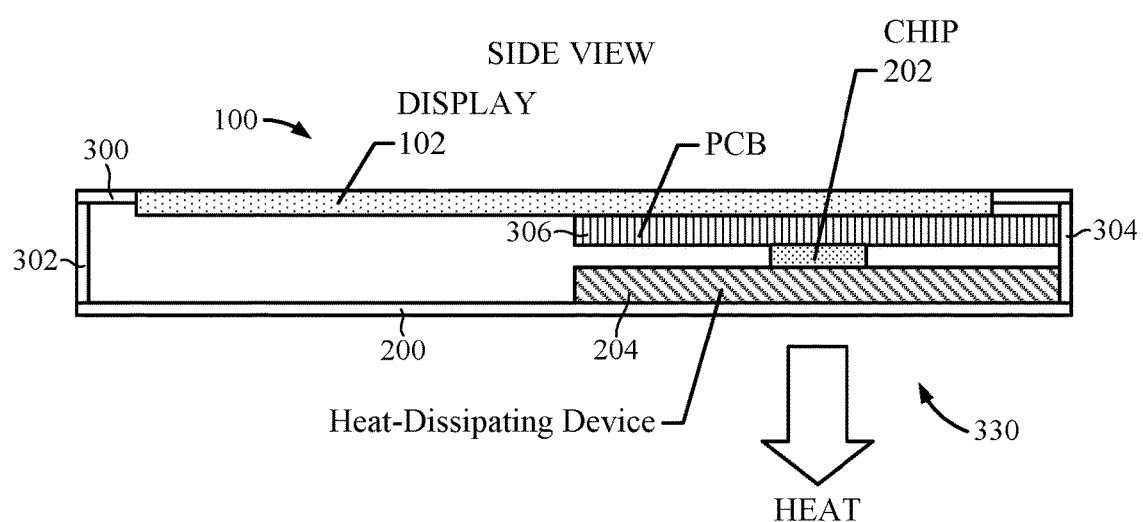
FIG. 3 illustrates a cross-sectional view of the example mobile device of FIG. 1.

FIGS. 1-3 illustrate an example of a mobile device that includes a heat-dissipating device for dissipating heat generated by an integrated circuit (IC) (also referred to as a chip). As shown in FIGS. 1 and 2, the mobile device 100 includes a display 102, a back side surface 200, a die 202, and a heat-dissipating device 204. The die 202 and the heat-dissipating device 204, which are both shown with dotted lines, are located inside the mobile device 100. The die 202 may be coupled to a first surface of the heat-dissipating device 204. A second surface of the heat-dissipating device 204 may be coupled to an inner surface of the back side surface 200.

FIG. 3 illustrates a profile view of the mobile device 100 that includes the heat-dissipating device 204. As shown in FIG. 3, the mobile device 100 includes the display 102, the back side surface 200, a front side surface 300, a bottom side surface 302, and a top side surface 304. FIG. 3 also illustrates a printed circuit board (PCB) 306, the die 202, and the heat-dissipating device 204 inside the mobile device 100.

As further shown in FIG. 3, a first side of the die 202 is coupled to a first surface of the PCB 306. A second side of the die 202 is coupled to a first surface of the heat-dissipating device 204. A second surface of the heat-dissipating device 204 is coupled to a first surface (e.g., inner surface) of the back side surface 200. In this configuration, heat that is generated by the die 202 is dissipated through the heat-dissipating device 204 and the back side surface 200 of the mobile device as well as through the PCB 306 and display 102.

Example Heat-Dissipating Device

With rising power demands and shrinking device sizes, integrated circuits (ICs) rely on heat-storage solutions to control junction and skin temperatures for reliable and safe operation. Heat-storage solutions, including integration of phase change materials (PCMs) (e.g., paraffin) with heat spreaders (e.g., graphite heat spreader), may facilitate dissipating heat generated by the ICs. Overall thermal performance and mechanical robustness of conventional heat-storage solutions are limited by interfacial properties of materials contacting the PCMs. For example, current heat-storage solutions may have incomplete contact areas with the PCM, resulting in air gaps that increase the interfacial thermal resistance. Conventional heat-storage solutions may also have intrinsic boundary resistivities between the PCM and a metallic material that affect the interfacial thermal resistance.

Certain aspects of the present disclosure provide a heat-dissipating device that increases effectiveness and robustness of heat dissipation via interfacial enhancements, such as increasing the contact area between an interposer and PCM integrated with heat spreaders, as further described herein. For example, an interfacial layer may be disposed on the interposer to increase the contact area with the PCM. As another example, the interposer may have a functionalized surface, as further described herein, to increase the contact area with the PCM. In certain aspects, the interposer may have the functionalized surface in combination with the interfacial layer to enhance the contact area with the PCM.

Figure 4A:
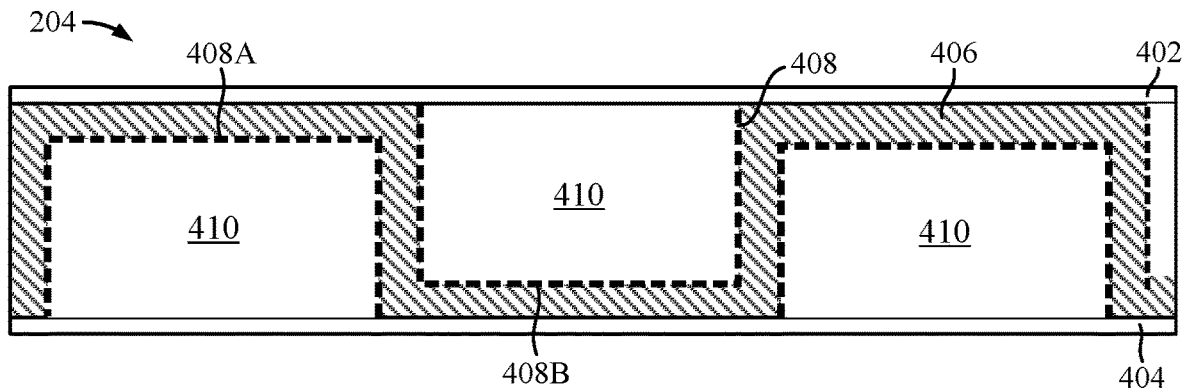
FIG. 4A illustrates a cross-sectional view of an example heat-dissipating device with an interfacial layer, in accordance with certain aspects of the present disclosure.

FIG. 4A illustrates a cross-sectional view of an example heat-dissipating device 204 that may be thermally coupled to a region (e.g., of an electronic device) configured to generate heat (e.g., die 202 of FIGS. 2 and 3) during operation, in accordance with certain aspects of the present disclosure. As shown, the heat-dissipating device 204 includes a first heat spreader 402, a second heat spreader 404, an interposer 406, an interfacial layer 408, and at least one PCM 410.

The first heat spreader 402 may be thermally coupled to the region configured to generate heat, such as the die 202 depicted in FIGS. 2 and 3. The second heat spreader 404 may be thermally coupled to another surface of an electronic device, such as the inner surface of the back side surface 200 as depicted in FIGS. 2 and 3. The first and second heat spreaders 402, 404 may include at least one of metal, carbon, graphite, and/or aluminum. In certain aspects, at least one of the heat spreaders 402, 404 has a thermal conductivity value of about 300 W/m-K or higher. In other aspects, at least one of the heat spreaders 402, 404 has a thermal conductivity value of about 500 W/m-K or higher (e.g., graphite).

Figure 4B:
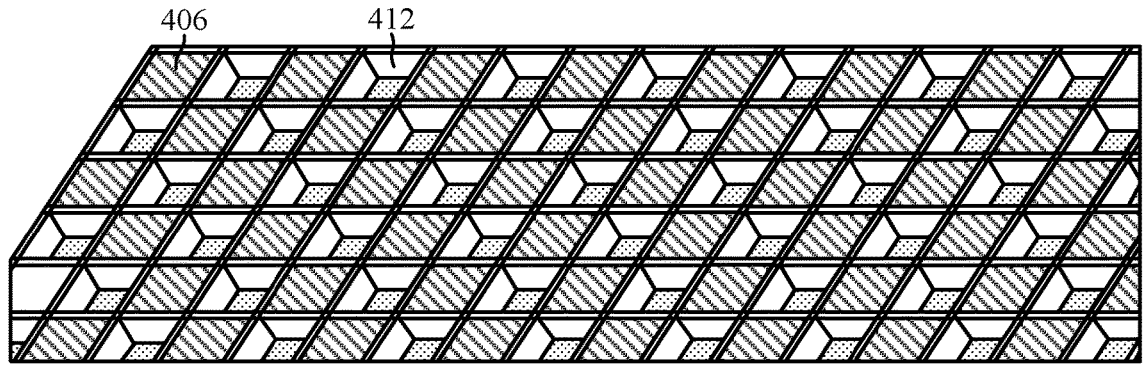
FIG. 4B illustrates a perspective view of the traversal of an interposer, in accordance with certain aspects of the present disclosure.

The interposer 406 may be thermally coupled to at least one of the first heat spreader 402 or the second heat spreader 404. The interposer may include a thermally conductive metallic material including but not limited to copper, gold, and/or silver. The interposer 406 may periodically traverse the PCM 410, alternating between contacting the first heat spreader 402 and the second heat spreader 404, as portrayed in the two-dimensional cross-sectional view of FIG. 4A. In three dimensions, the interposer 406 may form a cross-hatched (checker board) pattern as shown in the example perspective view of FIG. 4B, in accordance with certain aspects of the present disclosure. Referring to FIG. 4B, the PCM may be disposed in the trenches 412 of the patterned interposer 406.

Referring to FIG. 4A, to enhance the contact area between the interposer 406 and PCM 410, at least one interfacial layer 408 may be disposed on at least one surface of the interposer 406. The interfacial layer(s) 408 may be composed of any of various suitable thermally conductive materials capable of filling small volumes, such as a graphene material. The graphene material may be applied in any of various suitable forms, such as carbon nanotubes (CNTs). The interfacial layer(s) 408 may include a first graphene layer 408A disposed on a lower surface of an upper portion of the interposer 406 and a second graphene layer 408B disposed on an upper surface of a lower portion of the interposer 406, as illustrated in the example of FIG. 4A. In certain aspects, the interfacial layer 408 may reduce a thermal resistivity between the interposer 406 and the PCM 410. For instance, the interfacial layer 408 may provide an improved wettability between the interposer 406 and PCM 410. In certain aspects, the interfacial layer 408 may enable the interposer 406 to match fidelity of phases of the PCM 410.

The PCM 410 may include a plurality of PCMs having similar and/or different melting temperatures. The PCM 410 may include, for example, a paraffin wax, a high performance wax, and/or gallium. The high performance wax may have a heat of fusion of about 200,000 J/kg and a melting point/melting temperature of about 35° C. The gallium-based material may have a heat of fusion of about 80,000 J/kg and a melting point/melting temperature of about 29-31° C.

Figure 4C:
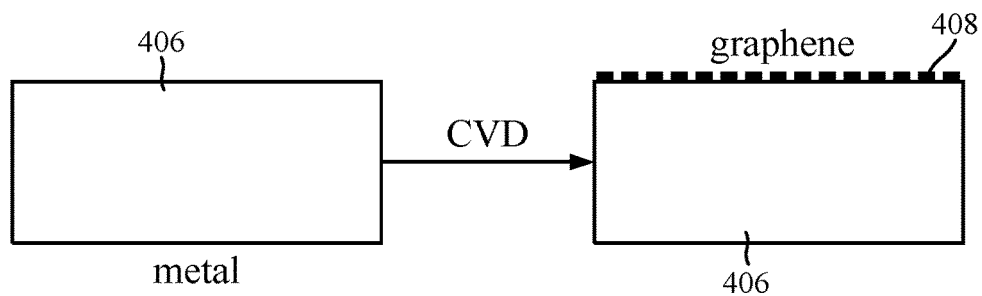
FIG. 4C illustrates an example operation of depositing the interfacial layer on the interposer, in accordance with certain aspects of the present disclosure.

FIG. 4C illustrates an example operation of depositing the interfacial layer 408 on the interposer 406, in accordance with certain aspects of the present disclosure. As shown, the interfacial layer 408 may be disposed on a surface of the interposer 406 via a deposition technique, such as a chemical vapor deposition (CVD) process.

Figure 5A:
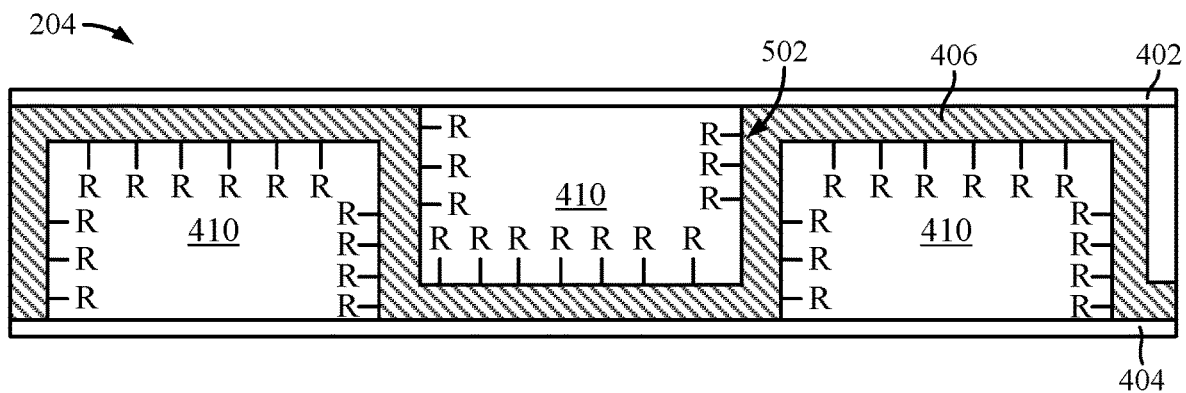
FIG. 5A illustrates a cross-sectional view of an example heat-dissipating device with a functionalized surface, in accordance with certain aspects of the present disclosure.
Figure 5B:
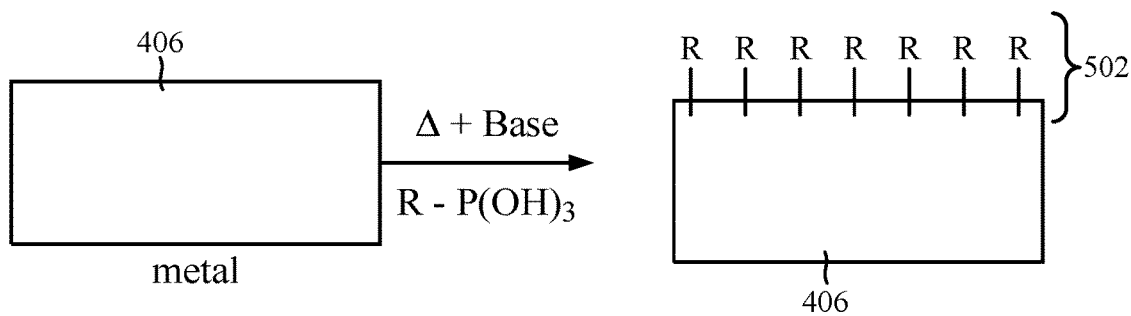
FIG. 5B illustrates an example operation of forming a functionalized surface of an interposer, in accordance with certain aspects of the present disclosure.
Figure 5C:
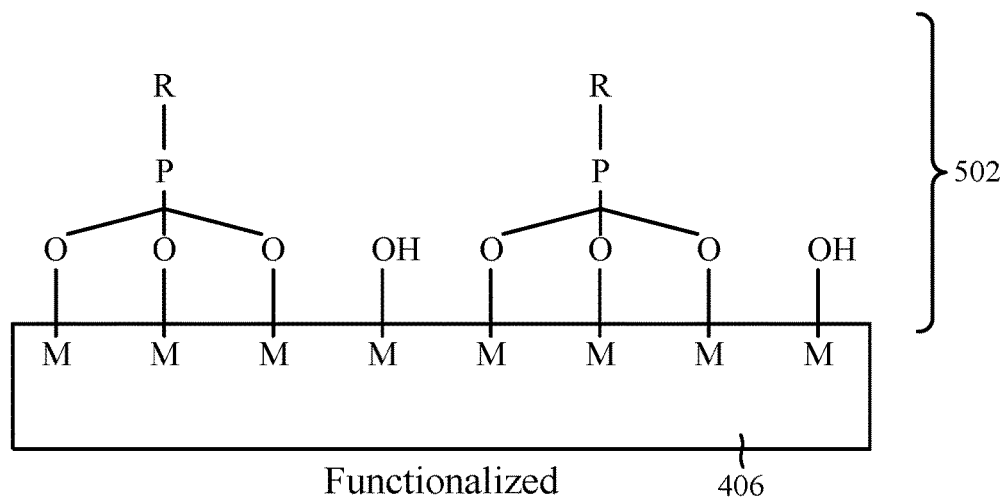
FIG. 5C illustrates an example interposer having a phosphorous-based functionalized surface, in accordance with certain aspects of the present disclosure.

In certain aspects, the interposer 406 may have a functionalized surface that increases the contact area with the PCM. For example, FIG. 5A illustrates a cross-sectional view of the example heat-dissipating device 204 with a functionalized surface 502 of the interposer 406, in accordance with certain aspects of the present disclosure. The functionalized surface 502 may be formed through a solution- or vapor-phase functionalization. As an example, the surface of the interposer 406 may be modified via vapor-phase reactions with an R-group material (e.g., a long-chain alkane molecule) as illustrated in FIG. 5B. The R-group material may be any suitable material that facilitates a reduced thermal resistance and enhanced wettability with the PCM 410. As an example, the R-group material may include a phosphorous material, such as R-PO$_3$, as depicted in FIG. 5C. As shown in FIG. 5C, the R-group material of the functionalized surface 502 may bond with an oxide surface of the metallic interposer 406. The R-group material may be selected to form a polymer structure on the surface of the interposer 406 such that the functionalized surface 502 increases the contact area between the PCM 410 and interposer 406.

Figure 6:
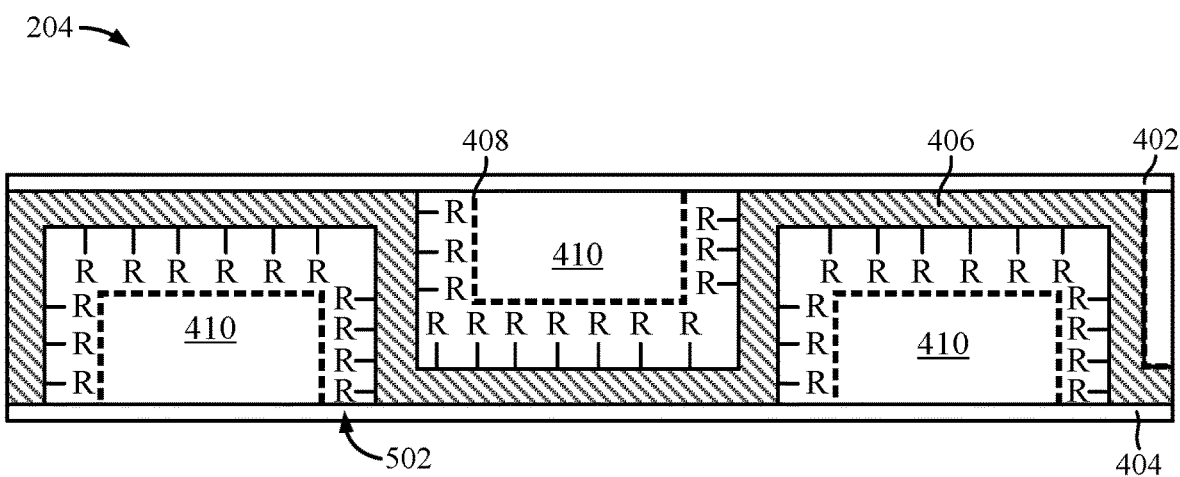
FIG. 6 illustrates a cross-sectional view of an example heat-dissipating device with a functionalized surface and an interfacial layer, in accordance with certain aspects of the present disclosure.

In certain aspects, the interposer 406 may have a functionalized surface and an interfacial layer 408. For example, FIG. 6 illustrates a cross-sectional view of the example heat-dissipating device 204 with a functionalized surface 502 and an interfacial layer 408, in accordance with certain aspects of the present disclosure. As shown, the interfacial layer 408 may be disposed on the functionalized surface 502 of the interposer 406.

Figure 7:
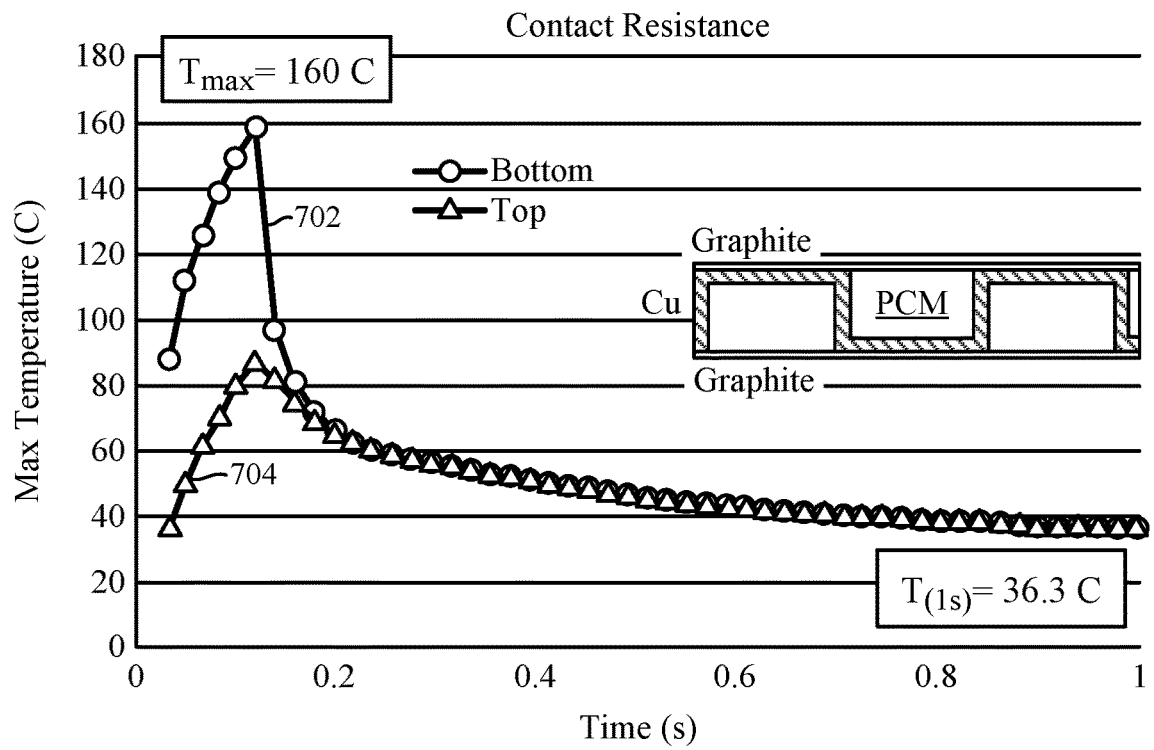
FIG. 7 illustrates an example graph of transient heat storage for a heat-dissipating device without interfacial modifications.
Figure 8:
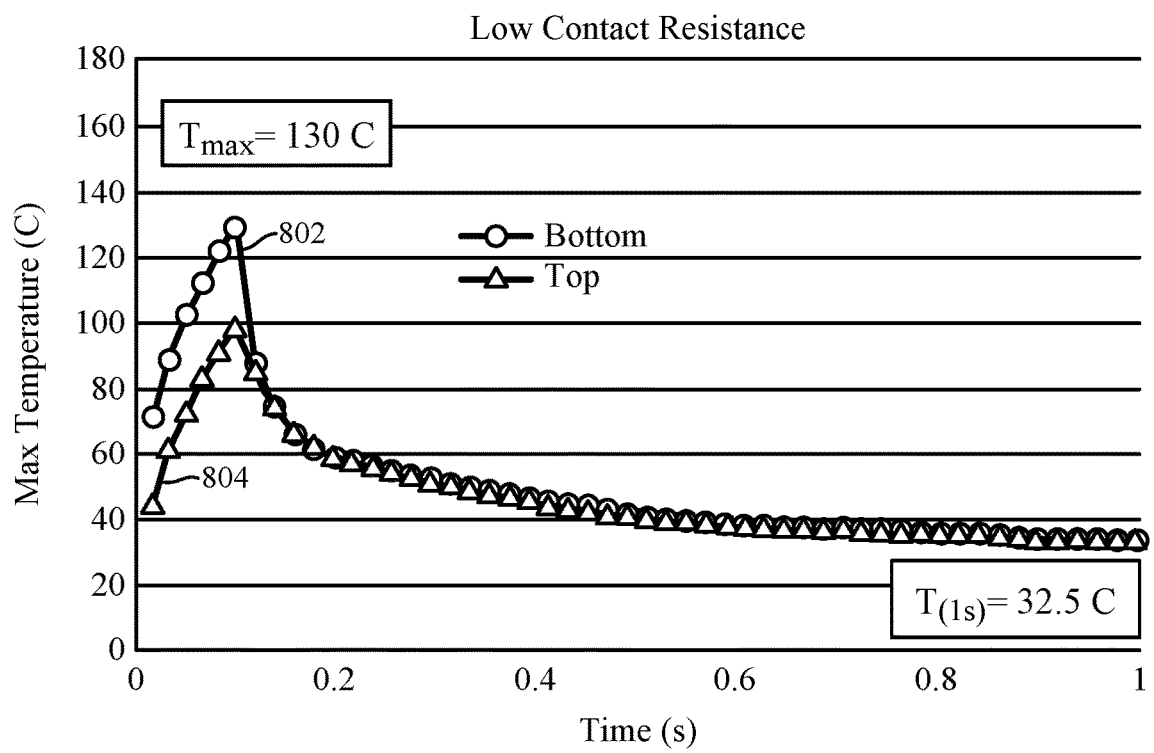
FIG. 8 illustrates an example graph of transient heat storage for an example heat-dissipating device with interfacial modifications, in accordance with certain aspects of the present disclosure.

FIGS. 7 and 8 illustrate example graphs of transient heat storage for heat-dissipating devices. As shown, curves 702 and 704 represent the maximum temperatures over time in seconds for the bottom and top surfaces, respectively, of a heat-dissipating device without any interfacial modifications. Curves 802 and 804 represent the maximum temperatures in seconds for the bottom and top surfaces, respectively, of an example heat-dissipating device with interfacial modifications, such as the functionalized surface 502 and/or the interfacial layer 408. FIG. 8 demonstrates that the example heat-dissipating device described herein provides enhanced thermal resistivity resulting in a reduced peak temperature (130° C.) and reduced steady state temperature (32.5° C.). In contrast, the heat-dissipating device without interfacial modifications exhibits a peak temperature of 160° C. and a steady state temperature of 36.3° C.

Figure 9:
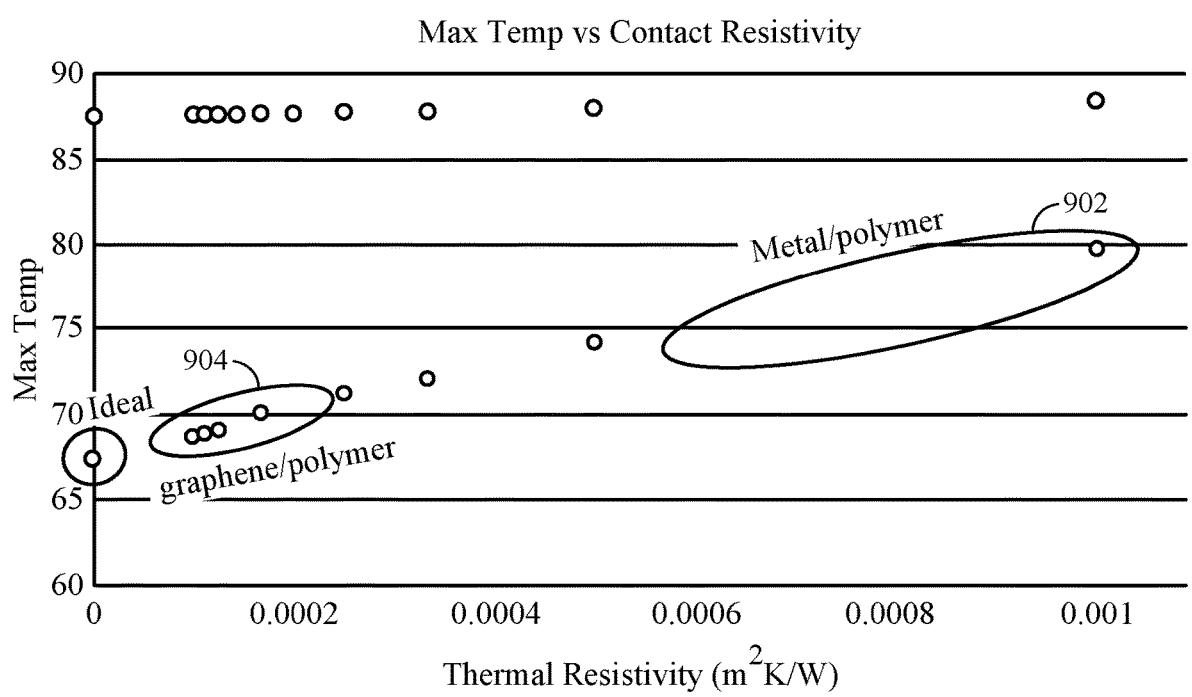
FIG. 9 illustrates an example graph of junction temperatures of various heat-dissipating devices versus thermal resistivity, in accordance with certain aspects of the present disclosure.

FIG. 9 illustrates an example graph of junction temperatures of various heat-dissipating devices, in accordance with certain aspects of the present disclosure. As shown, various maximum junction temperatures (Celsius) as a function of thermal resistivities are plotted. The junction temperatures within a first region 902 represent the temperatures exhibited by a heat-dissipating device without interfacial modifications, whereas the junction temperatures within the second region 904 represent the temperatures exhibited by the example heat-dissipating device with interfacial modifications as described herein. FIG. 9 demonstrates that the example heat-dissipating device described herein with interfacial modifications provides improved thermal resistivity and reduced peak temperatures.

Means for spreading heat may include a heat spreader, such as the heat spreaders 402, 404 depicted in FIGS. 4A, 5A, and 6. Means for separating the heat spreaders may include an interposer, such as the interposer 406 depicted in FIGS. 4A, 5A, and 6. Means for storing heat may include a phase change material, such as the PCM 410 illustrated in FIGS. 4A, 5A, and 6. Means for reducing a thermal resistivity may include an interfacial layer, such as the interfacial layer 408 depicted in FIGS. 4A and 6, and/or a functionalized surface of an interposer, such as the functionalized surface 502 shown in FIGS. 5A and 6.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The invention claimed is:

1. A heat-dissipating device, comprising:
a first heat spreader configured to be thermally coupled to a region configured to generate heat;
a second heat spreader;
an interposer thermally coupled to at least one of the first heat spreader or the second heat spreader, wherein the interposer has a functionalized surface comprising alkane molecules;
at least one interfacial layer comprising a graphene material disposed on at least one surface of the interposer, wherein the at least one surface of the interposer comprises the functionalized surface; and
a phase change material disposed between the at least one interfacial layer and at least one of the first heat spreader or the second heat spreader and thermally coupled to at least one of the first heat spreader or the second heat spreader.

2. The heat-dissipating device of claim 1, wherein the at least one interfacial layer comprises a first graphene layer disposed on an upper surface of the interposer and a second graphene layer disposed on a lower surface of the interposer.

3. The heat-dissipating device of claim 1, wherein the interfacial layer is configured to reduce a thermal resistivity between the interposer and the phase change material.

4. The heat-dissipating device of claim 1, wherein the interposer periodically traverses the phase change material, alternating between contacting the first heat spreader and the second heat spreader.

5. The heat-dissipating device of claim 1, wherein the interposer comprises a thermally conductive metallic material.

6. The heat-dissipating device of claim 1, wherein the interposer comprises at least one of copper, gold, or silver.

7. The heat-dissipating device of claim 1, wherein the functionalized surface is configured to increase a contacting area between the at least one interfacial layer and the phase change material.

8. The heat-dissipating device of claim 1, wherein the functionalized surface comprises a phosphorous material.

9. A heat-dissipating device, comprising:
a first heat spreader configured to be thermally coupled to a region configured to generate heat;
a second heat spreader;
an interposer comprising at least one functionalized surface and thermally coupled to at least one of the first heat spreader or the second heat spreader, wherein the functionalized surface comprises alkane molecules; and
a phase change material disposed between the interposer and at least one of the first heat spreader or the second heat spreader and thermally coupled to at least one of the first heat spreader or the second heat spreader, wherein the at least one functionalized surface of the interposer is configured to increase a contacting area between the interposer and the phase change material.

10. The heat-dissipating device of claim 9, wherein the functionalized surface comprises a phosphorous material.

11. The heat-dissipating device of claim 9, wherein the functionalized surface is configured to reduce a thermal resistivity between the interposer and the phase change material.

12. The heat-dissipating device of claim 9, wherein the interposer periodically traverses the phase change material, alternating between contacting the first heat spreader and the second heat spreader.

13. The heat-dissipating device of claim 9, wherein the interposer comprises a thermally conductive metallic material.

14. The heat-dissipating device of claim 9, wherein the interposer comprises at least one of copper, gold, or silver.

15. The heat-dissipating device of claim 9, further comprising at least one interfacial layer comprising a graphene material disposed on a surface of the interposer.

16. The heat-dissipating device of claim 15, wherein the at least one interfacial layer comprises a first graphene layer disposed on an upper surface of the interposer and a second graphene layer disposed on a lower surface of the interposer.

17. An apparatus, comprising:
first means for spreading heat configured to be thermally coupled to means for generating heat;
second means for spreading heat;
means for separating the first means for spreading heat from the second means for spreading heat, the means for separating being thermally coupled to at least one of the first means for spreading heat or the second means for spreading heat, wherein the means for separating has a functionalized surface comprising alkane molecules;
means for storing heat disposed between the means for separating and at least one of the first means for spreading heat or the second means for spreading heat and thermally coupled to at least one of the first means for spreading heat or the second means for spreading heat; and
means for reducing a thermal resistivity between the means for separating and the means for storing heat.

18. The apparatus of claim 17, wherein the means for separating periodically traverses the means for storing heat, alternating between contacting the first means for spreading heat and the second means for spreading heat.

19. The apparatus of claim 17, wherein the means for separating comprises a thermally conductive metallic material.

20. The apparatus of claim 17, wherein the functionalized surface comprises a phosphorous material.

* * * * *